United States Patent [19]
Nguyen et al.

[11] Patent Number: 5,272,432
[45] Date of Patent: Dec. 21, 1993

[54] DAC CURRENT SOURCE WITH STABILIZING BIAS

[75] Inventors: Chinh D. Nguyen, San Jose; Wei-Chan Hsu, Cupertino, both of Calif.

[73] Assignee: Winbond Electronics N.A. Corporation, Santa Clara, Calif.

[21] Appl. No.: 691,712

[22] Filed: May 1, 1991

[51] Int. Cl.$^5$ .............................................. G05F 3/16
[52] U.S. Cl. ..................... 323/315; 323/312; 307/568
[58] Field of Search ............... 323/313, 314, 315, 316, 323/317, 312; 363/39; 307/568, 567

[56] References Cited

U.S. PATENT DOCUMENTS

| | | | |
|---|---|---|---|
| 3,932,768 | 1/1976 | Takahashi et al. | 307/237 |
| 4,703,250 | 10/1987 | Frappe | 323/317 |
| 5,105,145 | 4/1992 | Neth | 323/316 |

FOREIGN PATENT DOCUMENTS 0140822 8/1983 Japan .................................. 323/317

Primary Examiner—Steven L. Stephan
Assistant Examiner—Adolf Berhane
Attorney, Agent, or Firm—Skjerven, Morrill, MacPherson, Franklin & Friel

[57] ABSTRACT

In a digital-to-analog converter (DAC) current source including a current mirror, an output transistor biased by a reference voltage and a steering transistor, a structure and a method are provided to implement the DAC current source without current spikes in the output current. Current spikes in the output current are avoided by including a transistor acting as a low-pass filter between the steering transistor and the output transistor. In one embodiment, the DAC current source circuit is implemented by PMOS transistors.

24 Claims, 9 Drawing Sheets

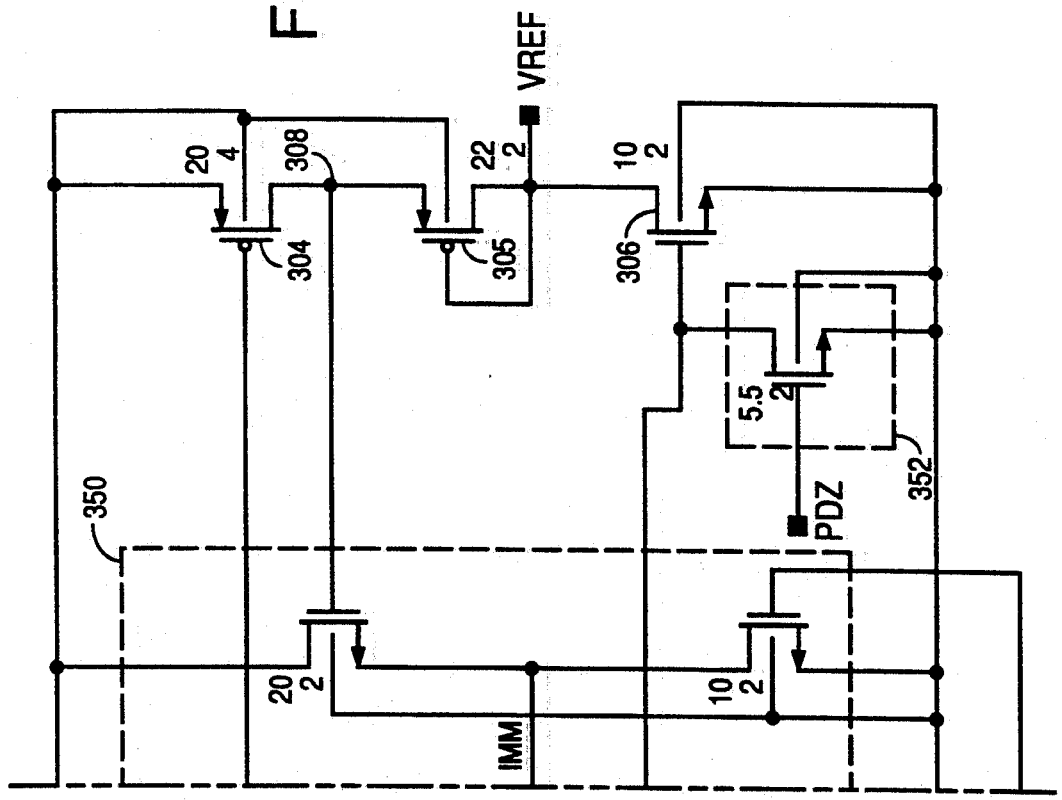
FIG. 3D"

```
*  PROJECT newdaclx by CHINH NGUYEN
. OPTION POST scale=1e-6 scalm=1
. OPTIONS BRIEF=0 nomod nopage
. PARAM TD=0n trf=1n pw=9n per=20n Vdacdec dacdec 0  PULSE {o, vdd, TD, TRF, TRF, PW, per}
Iref IREF 0 69uA
Vref VREF 0 1.2v
*Vdacdec dacdec 0  PWL {0ns 0v 5ns 0v 6ns vdd}

* * * * *

Cout  out  0  1pf
Lout  out  out1  7nH
Rout  out1  0  37.5
C     out1  0  5pf

* WorkVIEW Wirelist Created with version 3.11
MM1       N377 IREF VDD VDD PMOS L=4 W=20
MM2       IREF IREF VDD VDD PMOS L=4 W=20
c377      N377 0 0.01p
MM3       new vss N377 vdd PMOS L=1.5 W=15
MM4       OUT VREF N377 VDD PMOS L=2 W=15
MM102     new n382 vss vdd pmos l=1.5 w=15
M1        N382 DACDEC1 0 VSS NMOS L=1.5 W=6
M17       VDD DACDEC1 N382 VDD PMOS L=1.5 W=16
MX        DACDEC1 DACDEC 0 VSS NMOS L=1.5 W=6
MY        VDD DACDEC DACDEC1 VDD PMOS L=1.5 W=16
.TRAN .01NS 40NS
*.TEMP 100
.PRINT I{MM1} I{MM2} I{MM3} I{MM4} V{IREF} V{N377} V{OUT} V{OUT1}
.print i{mm100}
.LIB '/merc4c/w478/level3' typ5.0
.END
```

FIG. 4

DAC CURRENT SOURCE WITH STABILIZING BIAS

CROSS REFERENCE TO RELATED APPLICATIONS

Copending U.S. patent application, Ser. No. 07/691,710, entitled "Switchable Current-Reference Voltage Generator," by W. Hsu et al., filed on the same day as the present Application, also assigned to the Assignee of the present Application, is hereby incorporated by reference in its entirety.

Copending U.S. patent application, Ser. No. 07/691,711, entitled "Dual Sense Amplifier Structure for Video RAMDACs," by W. Hsu et al. filed on the same day as the present Application, also assigned to the Assignee of the present Application, is hereby incorporated by reference in its entirety.

FIELD OF THE INVENTION

This invention relates to the design of integrated circuits, and in particular, relates the design of current sources in integrated circuits.

BACKGROUND OF THE INVENTION

Fast-switching current sources are found in high-speed digital-to-analog converters (DACs) used in a variety of applications, such as video display devices. Desirable qualities in these fast-switching current sources are, for example, low susceptibility to noise and short switching times.

FIG. 1 shows a DAC current source circuit 100 known in the art. As shown in FIG. 1, circuit 100 comprises PMOS transistors 101-104. In circuit 100, the gate terminals of transistors 101 and 102 are connected in common and are biased by the voltage at the drain terminal of transistor 101. The current in the drain terminal of transistor 101 is constrained by a current reference signal IREF. The source terminals of transistors 101 and 102 are connected to the power supply VDD, typically 5 volts. Transistor 102's drain terminal is connected to the source terminals of transistors 103 and 104 at node 105. The gate terminals of transistors 103 and 104 are respectively provided the input signal SELECT and voltage reference signal VREF. The output current IOUT of the DAC current source circuit 100 is provided by the drain terminal of transistor 103.

The operation of circuit 100 can be understood by noting that a transistor's current in its source and drain terminals can be approximated by the equation:

$$I = 0.5 \; B \ast (V_1 - V_t)^2,$$

where

B is a parameter dependent upon the fabrication process and the dimensions of the transistor;

$V_1$ is the voltage difference between the gate and source terminals of the transistor; and $V_t$ is the threshold voltage of the transistor.

Since the threshold voltage $V_t$ and the parameter B are set by the fabrication process and does not normally vary during transistor operation, the voltage difference $V_1$ between the gate and source terminals of transistor 101 can be controlled by the current reference signal IREF. Because the gate terminals of transistors 101 and 102 are commonly connected, and both source terminals of transistors 101 and 102 are connected to the supply voltage VDD, the current in the source and drain terminals of transistor 102 can be maintained substantially constant by maintaining the current reference signal IREF constant. As a result, the bias voltage generated at the gate terminal of transistor 102 is also maintained constant. If the sizes of transistors 101 and 102 are substantially the same, PMOS transistor 101 and 102 form a "current mirror," in which a current substantially equal to IREF can be made to flow in the source and drain terminals of transistor 102. This constant current in transistor 102 is "steered" into one of the transistors 103 and 104 by the input signal SELECT, which can assume either a low voltage state or a high voltage state. An alternative method to achieving the same substantially constant current in the source and drain terminals of transistor 102 connects a suitable reference voltage source at the gate terminal of transistor 102, instead of using current mirror transistor 101 and the reference current IREF.

When the SELECT signal transitions to the low voltage state (i.e. circuit 100 is in the "nonactive mode"), transistor 104 operates at its saturation region (i.e. low impedance), and in turn, pulls the voltage at node 105 down to a voltage determined by the size of transistor 104. This non-active mode voltage at node 105 is designed not to exceed the voltage reference signal VREF by the threshold voltage $V_t$. As a result, transistor 103 is turned off when circuit 100 is in the non-active mode. Hence, the SELECT signal steers transistor 102's substantially constant current into transistor 104, resulting in only a very little amount of leakage current in the output current signal IOUT. A suitable value for the voltage reference signal VREF is 1.2 volts, which provides a high output impedance at the source terminal of transistor 103.

Conversely, when the SELECT signal transitions to the high voltage state, such as supply voltage VDD (i.e. circuit 100 is in the "active mode"), transistor 104 is turned "off" (i.e. high impedance), so that the voltage at node 105 rises. Circuit 100 is designed such that the voltage at node 105 rises sufficiently to turn on transistor 103, to cause transistor 102's substantially constant current to flow as the output current IOUT through the source terminal of transistor 103. In other words, the impedance across the source and drain terminals of transistor 104 when the SELECT signal is at supply voltage VDD is higher than the output impedance of transistor 103.

While circuit 100 is widely used, circuit 100 has a significant disadvantage, which results from the presence of parasitic capacitors in transistor 104. One such parasitic capacitor is the gate-to-source capacitor modelled by capacitor $C_1$ of FIG. 2, which shows circuit 100 with capacitor $C_1$ explicitly drawn to illustrate its effect. In practice, the capacitance of capacitor C1 is in the order of 0.2 pf.

When circuit 100 is in the non-active mode, the voltage difference between node 105 and the gate terminal of transistor 104 can be as much as 3 volts. However, as circuit 100 transitions to the active mode, i.e. signal SELECT transitions from ground voltage to the supply voltage VDD and, in the process, turning off transistor 104, the charge on capacitor C1 causes node 105 to overshoots momentarily the active mode steady-state voltage of node 105, causing a "current spike" in the output current signal IOUT during each transition. In many DAC designs, this current spiking effect is especially pronounced because the output currents of more than one current sources are combined. In such designs, current spikes in the commonly connected output signals of these current sources can occur simultaneously, resulting in a cumulative effect which can be detrimental to the quality of reference signals in the integrated circuit, such as the ground plane, and VREF.

Therefore, it is highly desirable to have a DAC current source which is not susceptible to the current spikes discussed above.

SUMMARY OF THE INVENTION

In accordance with the present invention, a structure and a method are provided to implement a DAC current source which is not susceptible to the current spikes of the prior art DAC current source. The DAC current source of the present invention provides means for smoothing the current spike during the DAC current source's transition from non-output mode to output mode. In one embodiment, the smoothing means is a transistor biased to be in the conducting state.

The present invention is better understood after consideration of the detailed description below and the accompanying drawings.

BRIEF DESCRIPTION OF THE DRAWINGS

FIG. 4 is a netlist for a circuit simulation of the DAC current source circuit 200a, using a circuit simulator HSPICE.

DETAILED DESCRIPTION OF THE PREFERRED EMBODIMENTS

Figure 1:
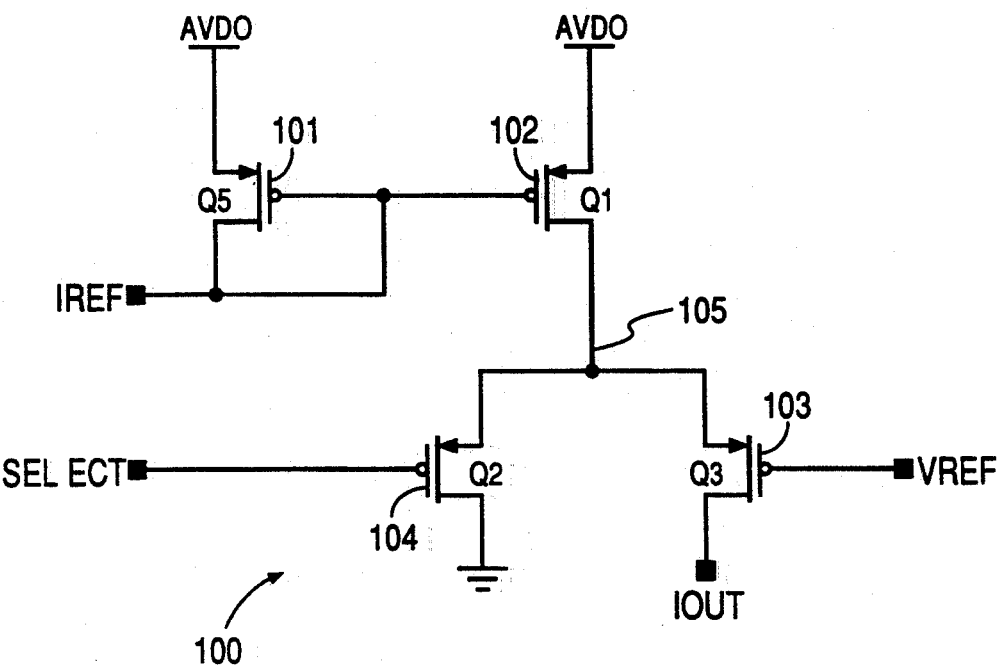
FIG. 1 shows a DAC current source circuit 100 widely used in the prior art.
Figure 2:
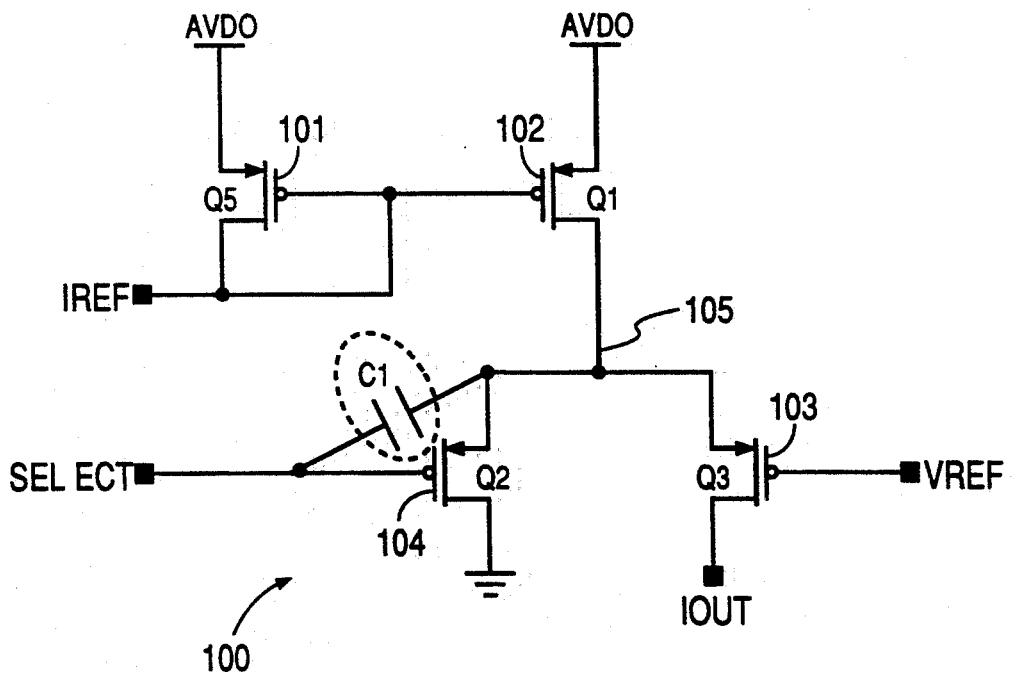
FIG. 2 shows the DAC current source circuit 100 of FIG. 1, with a parasitic capacitor C1 explicitly drawn to illustrate current-spiking in circuit 100.
Figure 3A:
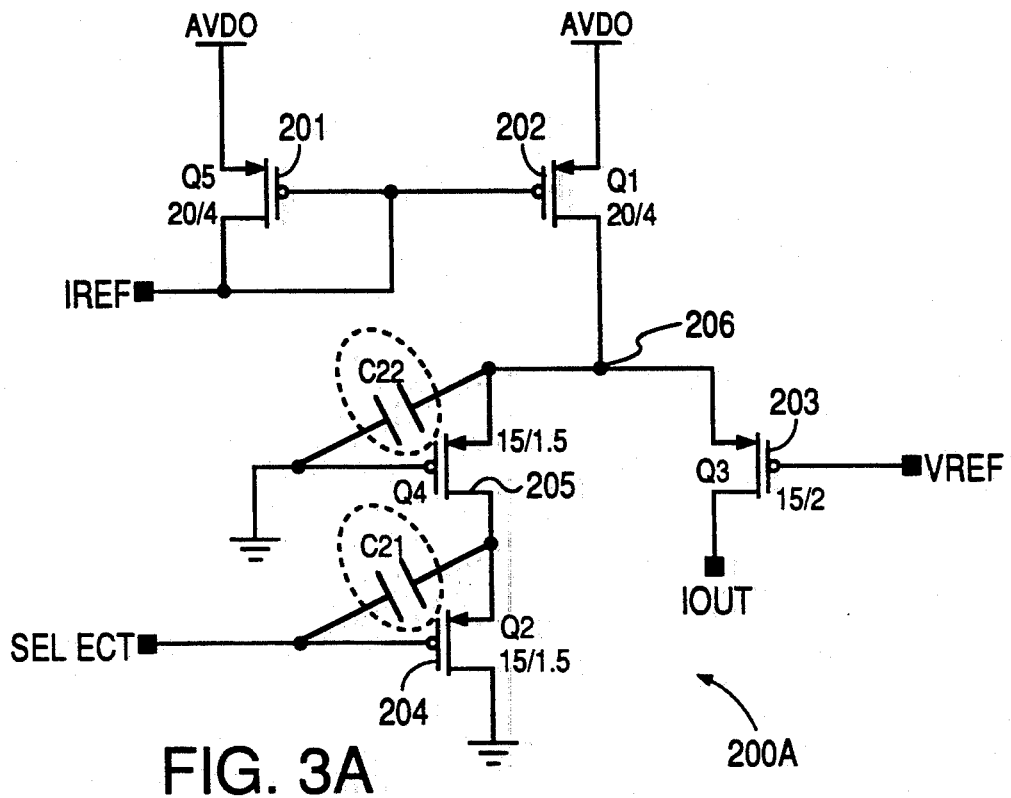
FIG. 3a shows a DAC current source circuit 200a using a current reference IREF in accordance with the present invention.

FIG. 3a shows a DAC current source circuit 200a in accordance with the present invention. In FIG. 3a, the PMOS transistors 201 and 202 are of equal size (e.g. a channel width-to-length (W/L) ratio of 20/4) forming a current mirror. The drain terminal of transistor 201 is provided a current reference signal IREF. PMOS transistor 203 and the combination of PMOS transistors 204 and 205 form alternative current paths for the current ("output current") flowing in the source and drain terminals of PMOS transistor 202. A suitable size for transistor 203 is a W/L ratio of 15/2 and a suitable size for both transistors 204 and 205 is a W/L ratio of 15/1.5. The gate terminal of transistor 203 is provided a reference bias voltage VREF, such as 1.2 volts, which causes a high output impedance at the drain terminal IOUT of transistor 203. The gate terminal of transistor 205 is connected to ground, so that transistor 205 is always in a conducting state. The gate terminal of transistor 204 is provided the "steering" or selection signal SELECT, which causes the output current to flow through transistors 204 and 205 when the SELECT signal is at 0 volts (ground voltage), and forces the output current through transistor 203, when the SELECT signal is at 5 volts (VDD).

During operation, when the SELECT signal transitions from 0 volts to 5 volts, in the absence of transistor 205, the voltage at node 206 would have risen sharply as transistor 204 transitions from a conducting state to a non-conducting state, due to the parasitic Miller capacitor $C_{21}$ between transistor 204's gate and source terminals. However, because there is no voltage change at the gate of transistor 205, the impedance in transistor 205's channel and its gate-to-source Miller capacitor $C_{22}$ form a low-pass filter, so as to prevent a corresponding sharp rise in voltage at node 206. Thus, no current spike results in the output current at drain terminal IOUT of transistor 203.

Figure 3B:
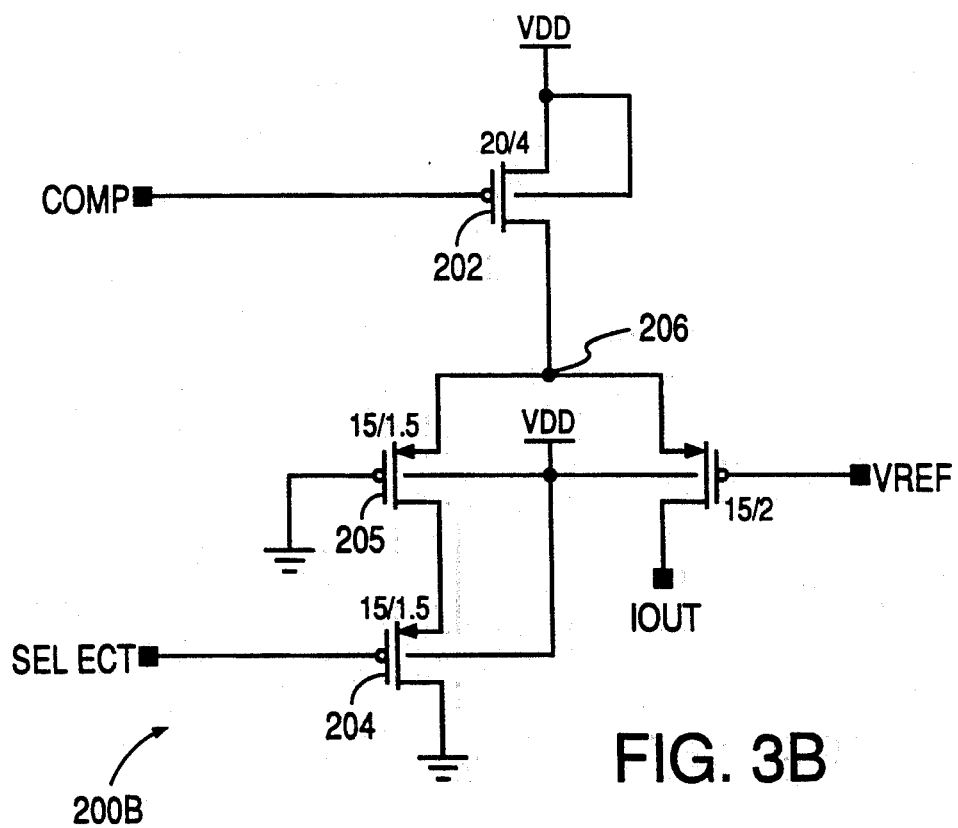
FIG. 3b shows another DAC current source circuit 200b using a voltage reference COMP in accordance with the present invention.

FIG. 3b shows a DAC current source circuit 200b using a voltage reference COMP at the gate terminal of transistor 202, rather than the current reference IREF provided by transistor 201 of FIG. 3a. The voltage VREF is also effective in providing the substantially constant current flowing in the drain and source terminals of transistor 202. It is understood that the same reference numerals are used in FIGS. 3a and 3b to denote corresponding circuit elements having the same function and/or structures.

Figure 3C:
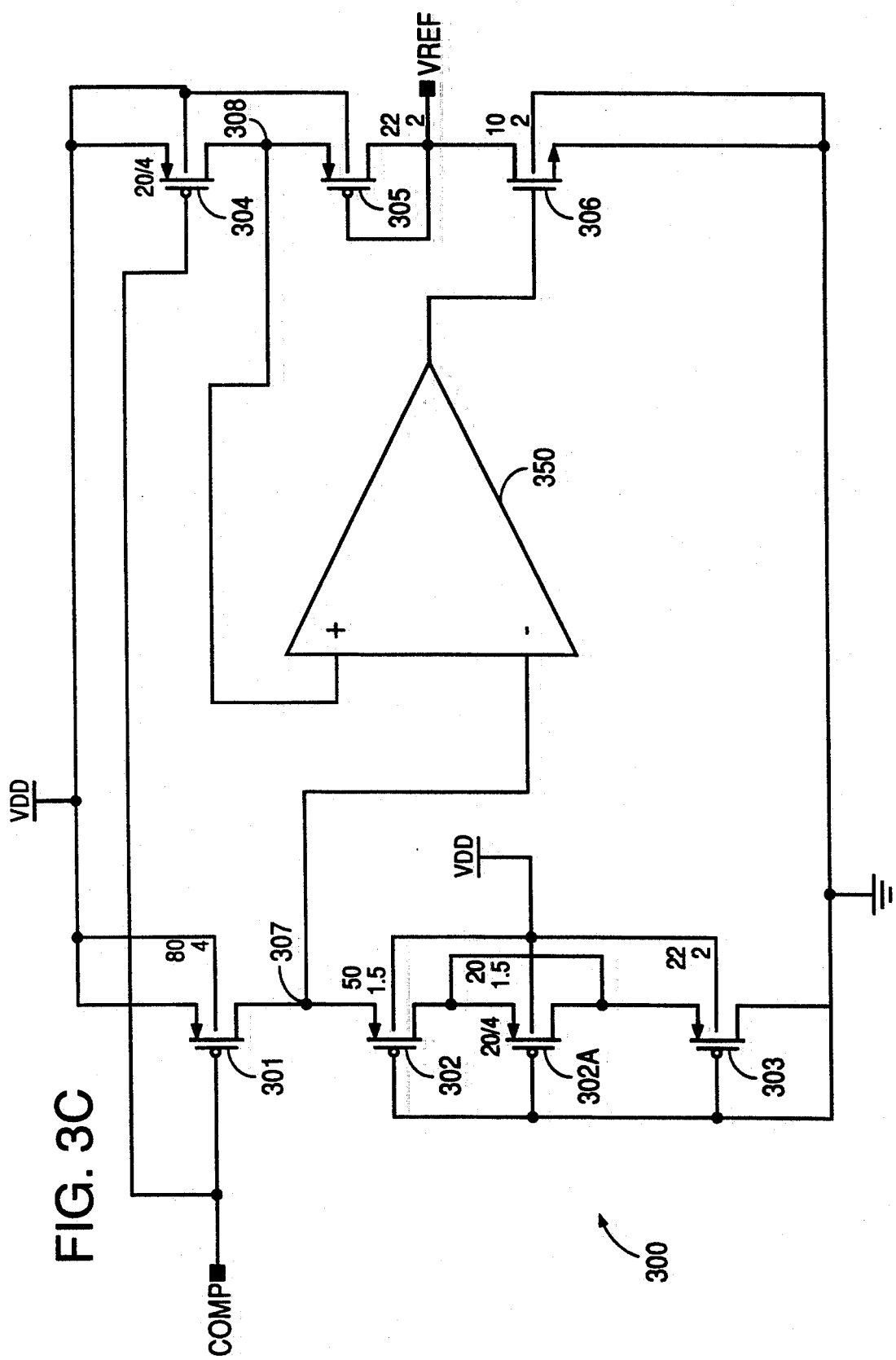
FIG. 3c, 3d' and 3d'' show in two levels of detail a circuit suitable for generating the voltage reference VREF used in both circuits 200a and 200b of FIGS. 3a and 3b.
Figure 3D:
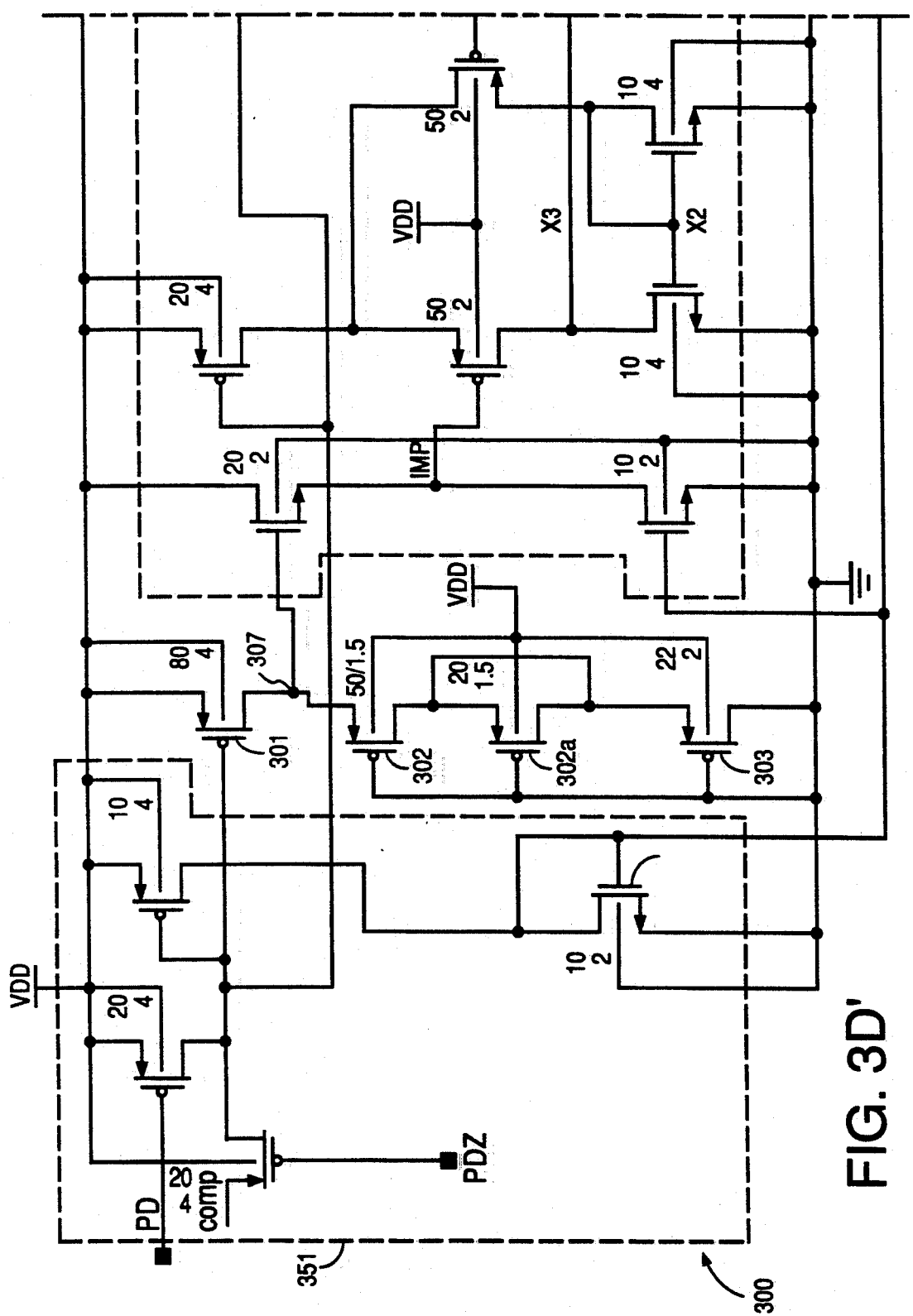

FIGS. 3c, 3d, 3d' and 3d'' show in two levels of detail the circuit 300 suitable for providing the voltage reference signal VREF of both circuits 200a and 200b. As shown in FIG. 3c, circuit 300 comprises PMOS transistors 301, 302, 302a, 303, 304 and 305, NMOS transistor 306, and differential amplifier 350. (The PMOS transistor 302a is shown here as having its source and drain terminals shorted. This transistor can be enabled should process variations require the size of transistor 302 to be smaller. If such occasion arises, the short circuit of transistor 302a can be opened by editing only a conductor layer in the manufacturing photolithographic plates to render transistor 302a functional). Not shown in FIG. 3c are power-down circuits 351 and 352 which together disable circuit 300 when the voltage reference signal VREF is supplied externally. The reference voltage VREF is designed such that the transistors 203 (in either circuit 200a of FIGS. 3a or circuit 200b of FIG. 3b) is maintained in the saturation region, when the SELECT signal is asserted (i.e. when transistor 203 is required to be in the "on" state), and to minimize leakage current, when the SELECT signal is deasserted (i.e. when transistor 203 is required to be in the "off" state). A desirable voltage for this purpose is provided by maintaining the voltage reference signal VREF at, when the SELECT signal is deasserted:

$$VREF = V_{206} - V_t + delta,$$

where
  $V_{206}$ is the voltage at node 206 (FIG. 3a or FIG. 3b),
  $V_t$ is the threshold voltage of transistor 203, and
  delta is a small "safe-guard" to ensure that the leakage current in transistor 203 is small.

To illustrate that circuit 300 provides this desired voltage VREF when the SELECT signal is deasserted, it is observed that transistors 301, 302 and 303 mimic the action of transistors 202, 203 and 204 of FIG. 3a, when the SELECT signal is deasserted (low voltage state). The voltages $V_{206}$ and $V_{307}$ at nodes 206 (FIG. 3a) and 307 (FIG. 3c) respectively are given by:

$$V_{206} = VGS_{204} + VDS_{205} \text{ and}$$

$$V_{307} = VGS_{303} + VDS_{302}$$

where $VGS_{204}$, $VDS_{205}$, $VGS_{303}$ and $VDS_{302}$ are the gate-to-source voltage of transistor 204, the drain-to-source voltage of transistor 205, the gate-to-source voltage of transistor 303 and the drain-to-source voltage of transistor 302, respectively.

The size of transistor 301 is designed such that its saturation current is approximately four times that of transistor 202. As a result, it can be shown that, as transistors 204 and 303 are both in saturation, $$VGS_{303} = 2\, VGS_{204} - V_t$$

Moreover, $$VDS_{302} = VDS_{205} + delta,$$

where delta is the small difference between the drain-to-source voltages of transistor 302 and 205. Hence, it can be seen that the voltage at node 307 is given by:

$$\begin{aligned}V_{307} &= 2\, VGS_{204} + VDS_{205} - V_t + delta \\ &= V_{206} + VGS_{204} - V_t + delta\end{aligned}$$

The differential amplifier 350, the PMOS transistors 304 and 305, and the NMOS transistor 306 are provided to equalize the voltages at nodes 307 and 308. Thus, since the difference between the output voltage reference signal VREF and the voltage at node 308 are constrained to be no more than the gate-to-source voltage $VGS_{305}$ of transistor 305, which is approximately equal to the $VGS_{204}$. VREF is provided by:

$$VREF = V_{206} - V_t + delta,$$

which is the desired voltage indicated above. The voltage $VGS_{305}$ and the voltage $VGS_{204}$ are approximately equal because the current in both transistors 204 and 305 are approximately the same, due to the substantially equal W/L ratios of transistors 304 and 202, and the substantially equal W/L ratios of transistors 204 and 305.

Suitable sizes for transistor 301–306 are respectively 80/4, 50/1.5, 20/4, 22/2 and 10/2. Other sizes in accordance with the principles described above can provide the desired effect, also.

FIG. 3d shows circuit 300 in further detail. Specifically, the transistor circuit of differential amplifier 350 is shown in FIG. 3d. In addition, power down circuits 351 and 352 are also provided to disable the reference voltage circuit 300, in the event an external voltage reference is used to provide the voltage reference signal VREF.

Figure 3E:
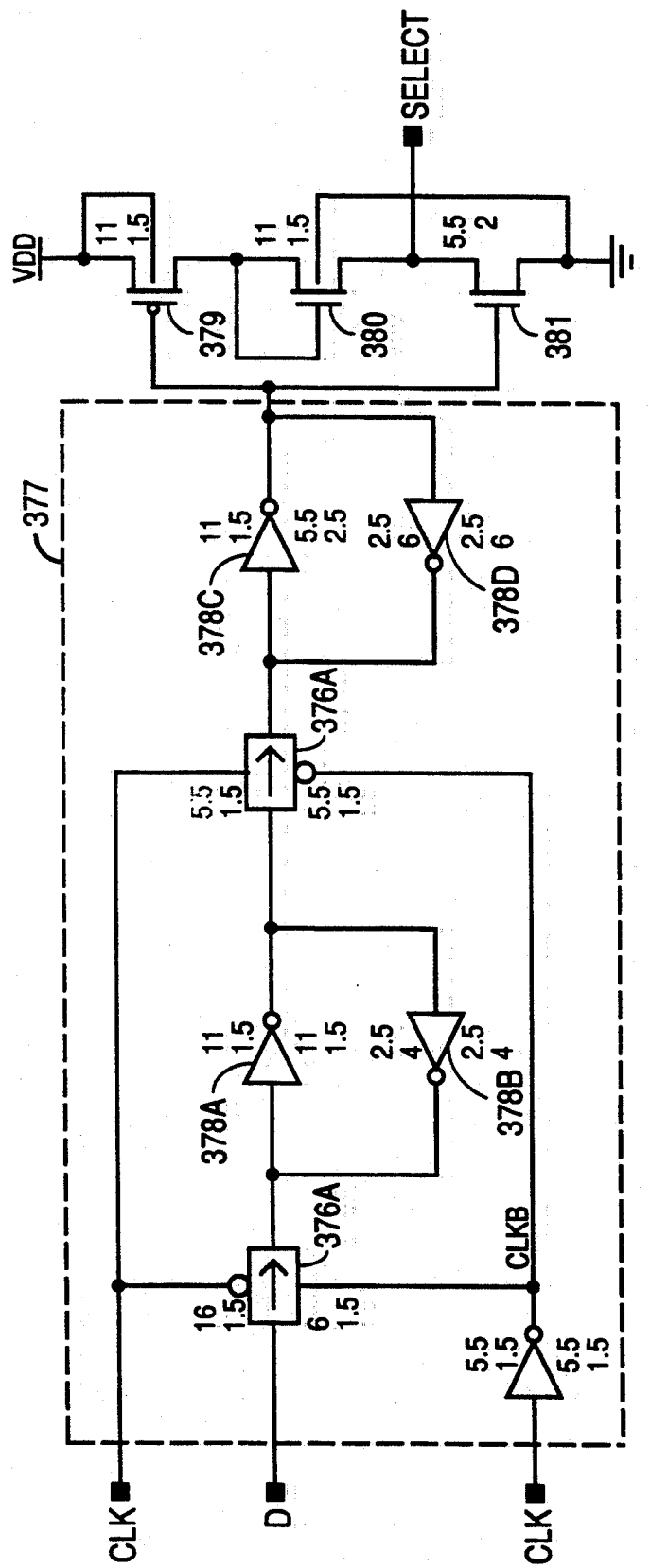
FIG. 3e shows a circuit 350 used to generate the steering voltage signal SELECT used in the circuits 200a and 200b of FIGS. 3a and 3b.

FIG. 3e shows the circuit 375 which provides the SELECT signal suitable for use in circuits 200a and 200b of FIGS. 3a and 3b. As shown in FIG. 3e, circuit 375 comprises a master/slave flip-flop 377 and an inverter comprising transistors 379, 380 and 381. Master/slave flip-flop 377 comprises transfer gates 376a and 376b, and two sets of cross-coupled inverters formed by inverters 378a–378d. Master/slave flip-flop 377 is therefore of conventional construction. However, many other flip-flops in the art are also suitable for the purpose of holding the input signal, which provided to the D-input of the Master/slave flip-flop 377. In the inverter formed by transistors 379, 380 and 381, transistor 380 is shown connected between the inverter's output and the pull-up transistor 379. Transistor 380 is provided to dampen the rise-time of the signal SELECT, in order to further reduce noise in the DAC circuit 200a or 200b during signal SELECT's transition from the low voltage state to the high voltage state. For example only, the transistors 380, 381 and 382 have sizes, expressed as W/L ratios, 11/1.5, 11/15, 5.5/2 respectively. Transistor 380 a PMOS transistor and transistors 381 and 382 are NMOS transistors.

Figure 5:
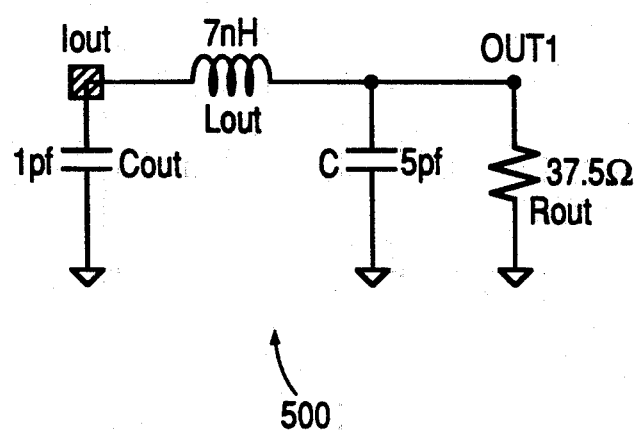
FIG. 5 is a circuit model of the output load typically driven by circuit 200a of FIG. 3a; this circuit model is included in the netlist of FIG. 4 and used in the circuit simulation.

The improvement in the output current of the DAC current source circuit 200a over the DAC current source circuit 100 in the prior art can be demonstrated by a circuit simulation. Such circuit simulation can be performed using a circuit simulator known in the art, such as HSPICE available from MegaSoftware, San Jose, Calif. A netlist of DAC current source circuit 200 suitable to be used with HSPICE is provided in FIG. 4. The syntax of an HSPICE netlist is well-known in the art. To provide a realistic simulation, the netlist of FIG. 4 also includes a load circuit connected to the output terminal IOUT. This load circuit, shown in FIG. 5, simulates the environment in which the DAC current source circuit 200 is expected to operate. As shown in FIG. 5, the load circuit consists of a 1-pf capacitor Cout, a 5-pf capacitor C, a 7-nH inductor LOUT and a 37.5-ohm resistor ROUT.

In FIG. 4, transistors 202 and 201 of circuit 200a are represented by the netlist's transistors MM1 and MM2 respectively; transistors 203 of circuit 200 is represented by the netlist's transistor MM4; and transistors 204 and 205 of circuit 200 are represented by the netlist's transistors M102 and MM3 respectively. A 0.01 pf dummy capacitor is provided to model the capacitance in circuit 200a's node 206 (node n377 in the netlist of FIG. 4). In the netlist of FIG. 4, two serially connected inverters formed by transistors M1, M17, MX and MY are used to provide the selection signal SELECT at the gate terminal of transistor M102 (FIG. 3's transistor 204). The simulation is performed with 0.01 ns time steps for 40 ns, using as input stimuli to the inverters two 10-ns voltage pulses, 10 ns apart.

Figure 6:
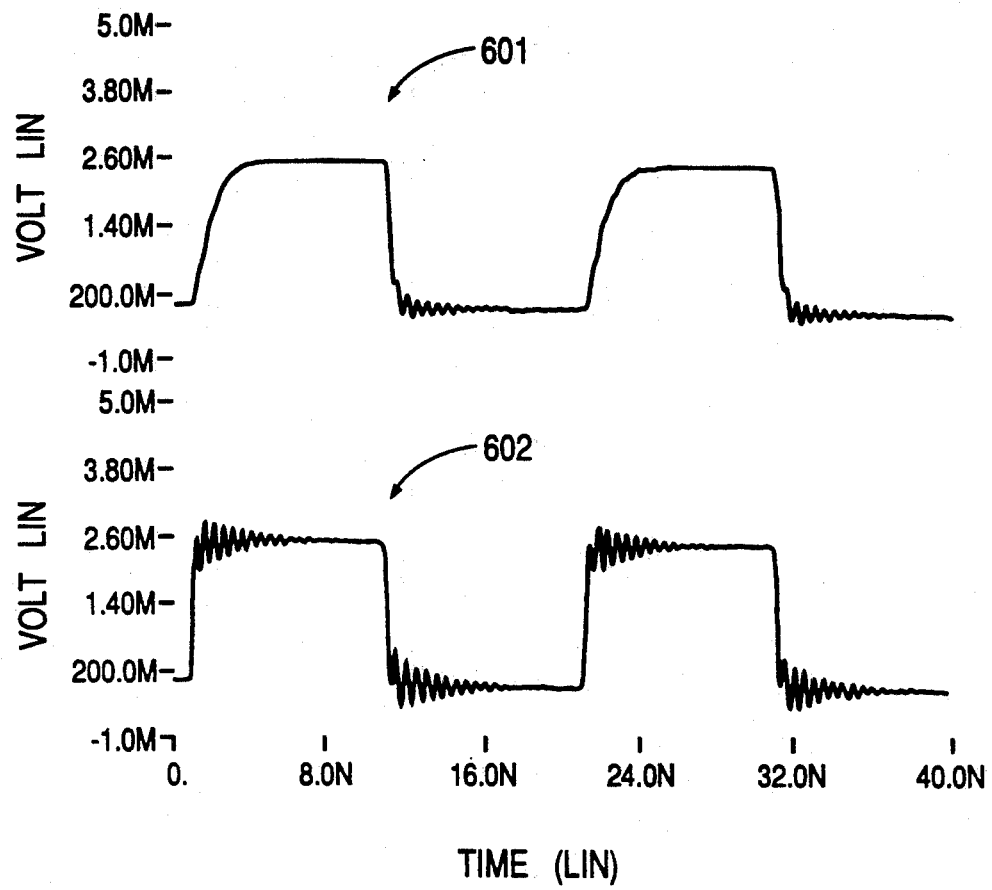
FIG. 6 illustrates the improvement of the current source waveform in DAC current source circuit 200a, in accordance with the present invention, over the prior art DAC current source circuit 100, as demonstrated by the circuit simulation using the netlist of FIG. 4.

The current waveform at the output terminal IOUT of circuit 200's transistor 203 is shown waveform 601 shown in the upper chart of FIG. 6. For comparison, the current waveform at the output terminal IOUT of circuit 100 of the prior art is provided as waveform 602 in the lower chart. As can be seen in FIG. 6, the current output waveform 602 shows much output noise ("ringing") in the current output whenever the output current is turned "on" (output current) or turned "off" (no output current). By contrast, waveform 601, in accordance with the present invention, shows a relatively spike-free output current.

Figure 7:
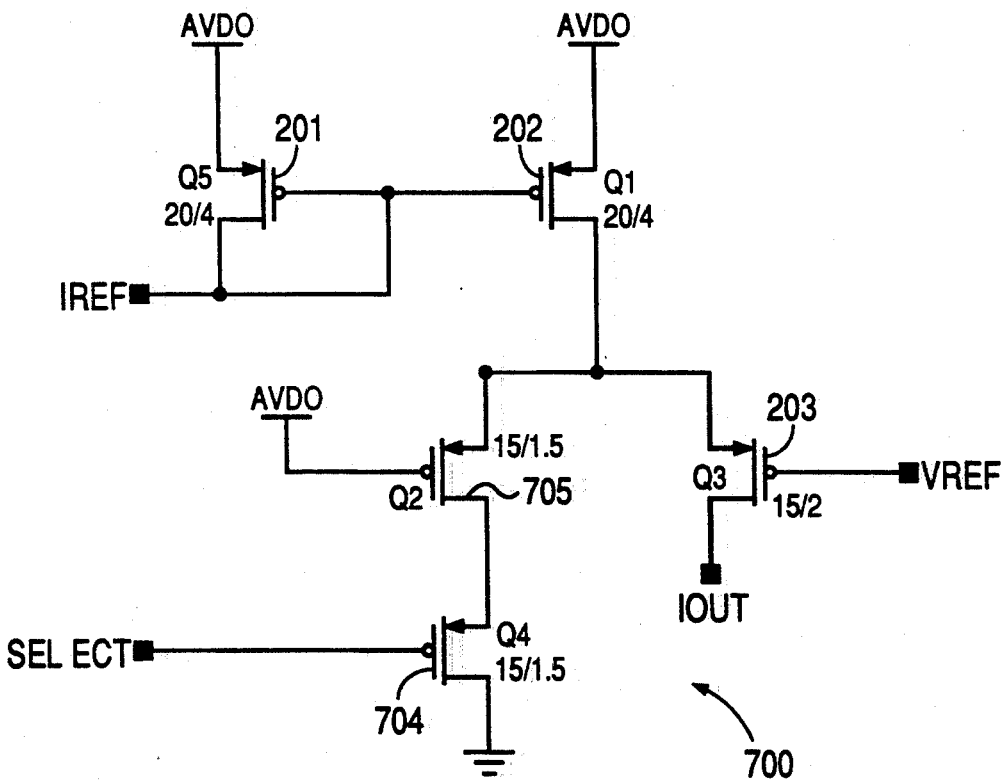
FIG. 7 is a the schematic diagram of a second embodiment of the present invention.

FIG. 7 shows DAC current source circuit 700, which is an alternative embodiment of the present invention. To facilitate comparison, like structures in circuits 200a and 700 are provided the same reference numerals. Whereas circuit 200a comprises exclusively PMOS transistors, in circuit 700, transistors 704 and 705 (analogous to transistors 204 and 205 of circuit 200a) are NMOS transistors. Using all PMOS transistors, as in circuit 200a, is advantageous from the silicon area standpoint, since the PMOS transistors can be very densely packed due to the simpler isolation requirement than if both NMOS and PMOS transistors are present. On the other hand, an NMOS transistor provides a higher current drive, as compared to a PMOS transistor of the same size, so that the NMOS transistors 704 and 705 of circuit 700 can be implemented by smaller transistors than the corresponding PMOS transistors 204 and 205 in circuit 200a.

The above detailed descriptions are provided to illustrate the specific embodiments of the present invention and not to limit the present invention. Numerous modifications and variations are possible within the scope of the present invention, which is defined by the following claims. For example, the low-pass filtering function of transistor 205 of FIG. 3a can be provided by an RC circuit.

We claim:

1. A DAC current source structure, comprising:
    means for generating a current;
    means connected to said generating means for providing said current for output;
    means controlled by a selection signal having first and second states for steering said current into said output means when said selection signal is in the first state; and
    means connected between said generating means and said steering means for smoothing current spikes in said current when said selection signals transitions between said first and second states.

2. A structure as in claim 1, wherein said generating means comprises a first transistor having gate, drain and source terminals, said gate terminal receiving a bias voltage to cause said current to flow in said drain and source terminals.

3. A structure as in claim 1, wherein said output means comprises a transistor having gate, source and drain terminals, said gate terminal of said transistor receiving a reference voltage to allow said current to flow in said source and drain terminals.

4. A structure as in claim 1, wherein said steering means comprises a transistor having gate, drain and source terminals, said gate terminal being connected to said selection signal, such that, when said selection signal is in said second state, said current flows in said drain and source terminals.

5. A structure as in claim 4, wherein said smoothing means comprises a transistor having gate, source and drain terminals, said gate terminal being provided a reference voltage to bias said transistor in a conducting state, such that, when said selection signal is in said second state, said current flows in said drain and source terminals of said transistor to said steering means.

6. A DAC current source structure, comprising:
    a first transistor having gate, source and drain terminals, said source terminal of said first transistor being connected to receive a first supply voltage, and said gate and drain terminals of said first transistor being connected to receive a reference current;
    a second transistor having gate, source and drain terminals, said source terminal of said second transistor being connected to receive said first supply voltage, said gate terminal of said second transistor being connected to said gate terminal of said first transistor;
    a third transistor having gate, source and drain terminals, said gate terminal of said third transistor being connected to receive a reference voltage, said drain terminal of said third transistor being connected to receive a second supply voltage and said source terminal of said third transistor being connected to said drain terminal of said second transistor;
    a fourth transistor having gate, source and drain terminals, said gate terminal of said fourth transistor being connected to receive said second supply voltage, said source terminal of said fourth transistor being connected to said drain terminal of said second transistor; and
    a fifth transistor having gate, source and drain terminals, said gate terminal of said fifth transistor being connected to receive a selection signal, said source terminal of said fifth transistor being connected to said drain terminal of said fourth transistor and said drain terminal of said fifth transistor being connected to receive said second supply voltage.

7. A DAC current source structure, comprising:
    a first transistor having gate, source and drain terminals, said source terminal of said first transistor being connected to receive a first supply voltage, and said gate and drain terminals of said first transistor being connected to receive a reference current;
    a second transistor having gate, source and drain terminals, said source terminal of said second transistor being connected to receive said first supply voltage, said gate terminal of said second transistor being connected to said gate terminal of said first transistor;
    a third transistor having gate, source and drain terminals, said gate terminal of said third transistor being connected to receive a reference voltage, said drain terminal of said third transistor being connected to receive a second supply voltage and said source terminal of said third transistor being connected to said drain terminal of said second transistor;
    a fourth transistor having gate, source and drain terminals, said gate terminal of said fourth transistor being connected to receive said first supply voltage, said drain terminal of said fourth transistor being connected to said drain terminal of said second transistor; and
    a fifth transistor having gate, source and drain terminals, said gate terminal of said fifth transistor being connected to receive a selection signal, said drain terminal of said fifth transistor being connected to said source terminal of said fourth transistor and said source terminal of said fifth transistor being connected to receive said second supply voltage.

8. A method for providing a DAC current source, comprising:
    providing for generating a current;
    providing means for outputting said current;
    providing means for steering said current into said output means in accordance when a selection signal having first and second states is in the first state; and smoothing current spikes in said current by means connected between said generating means and said steering means when said selection signals transitions between said first and second states.

9. A method as in claim 8, wherein said step of providing means for generating a current comprises the step of providing a first transistor having gate, drain and source terminals, said gate terminal receiving a bias voltage to cause said current to flow in said drain and source terminals.

10. A method as in claim 8, wherein said step of providing means for outputting a current comprises the step of providing a transistor having gate, source and drain terminals, said gate terminal of said transistor receiving a reference voltage to allow said current to flow in said source and drain terminals.

11. A method as in claim 8, wherein said step of providing means for steering a current comprises the step of providing a transistor having gate, drain and source terminals, said gate terminal being connected to said selection signal, such that, when said selection signal is in said second state, said current flows in said drain and source terminals.

12. A method as in claim 11, wherein said step of smoothing current spikes comprises the step of providing a transistor having gate, source and drain terminals, said gate terminal being provided a reference voltage to bias said transistor in a conducting state, such that, when said selection signal is in said second state, current flows in said drain and source terminals of said transistor to said steering means.

13. A method for providing a DAC current source, comprising the steps of:

providing a first transistor having gate, source and drain terminals, said source terminal of said first transistor being connected to receive a first supply voltage, and said gate and drain terminals of said first transistor being connected to receive a reference current;

providing a second transistor having gate, source and drain terminals, said source terminal of said second transistor being connected to receive said first supply voltage, said gate terminal of said second transistor being connected to said gate terminal of said first transistor;

providing a third transistor having gate, source and drain terminals, said gate terminal of said third transistor being connected to receive a reference voltage, said drain terminal of said third transistor being connected to receive a second supply voltage and said source terminal of said third transistor being connected to said drain terminal of said second transistor;

providing a fourth transistor having gate, source and drain terminals, said gate terminal of said fourth transistor being connected to receive said second supply voltage, said source terminal of said fourth transistor being connected to drain terminal of said second transistor; and providing a fifth transistor having gate, source and drain terminals, said gate terminal of said fifth transistor being connected to receive a selection signal, said source terminal of said fifth transistor being connected to said drain terminal of said fourth transistor and said drain terminal of said fifth transistor being connected to receive said second supply voltage.

14. A method for providing a DAC current source, comprising the steps of:

providing a first transistor having gate, source and drain terminals, said source terminal of said first transistor being connected to receive a first supply voltage, and said gate and drain terminals of said first transistor being connected to receive a reference current;

providing a second transistor having gate, source and drain terminals, said source terminal of said second transistor being connected to receive said first supply voltage, said gate terminal of said second transistor being connected to said gate terminal of said first transistor;

providing a third transistor having gate, source and drain terminals, said gate terminal of said third transistor being connected to receive a reference voltage, said drain terminal of said third transistor being connected to receive a second supply voltage and said source terminal of said third transistor being connected to said drain terminal of said second transistor;

providing a fourth transistor having gate, source and drain terminals, said gate terminal of said fourth transistor being connected to receive said first supply voltage, said drain terminal of said fourth transistor being connected to said drain terminal of said second transistor; and providing a fifth transistor having gate, source and drain terminals, said gate terminal of said fifth transistor being connected to receive a selection signal, said drain terminal of said fifth transistor being connected to said source terminal of said fourth transistor and said source terminal of said fifth transistor being connected to receive said second supply voltage.

15. An inverter structure having input and output terminals, comprising:

a PMOS transistor having gate, source and drain terminals said gate terminal of said PMOS transistor being connected to said input terminal, and said source terminal of said PMOS transistor being connected to a power voltage supply;

a first NMOS transistor having gate, source and drain terminals, said gate and said drain terminals of said first NMOS transistor being connected to said drain terminal of said PMOS transistor, and said source terminal of said first NMOS transistor being connected to said output terminal; and a second NMOS transistor having gate, source and drain terminals, said gate terminal of said second NMOS transistor being connected to said input terminal, said source terminal of said second NMOS transistor being connected to a ground voltage supply, and said drain terminal of said second NMOS transistor being connected to said output terminal.

16. A method for providing an inverter structure, having input and output terminals, comprising the steps of:

providing a PMOS transistor having gate, source and drain terminals said gate terminal of said PMOS transistor being connected to said input terminal, and said source terminal of said PMOS transistor being connected to said power voltage supply;

providing a first NMOS transistor having gate, source and drain terminals, said gate and said drain terminals of said first NMOS transistor being connected to said drain terminal of said PMOS transistor, and said source terminal of said first NMOS transistor being connected to said output terminal; and providing a second NMOS transistor having gate, source and drain terminals, said gate terminal of said second NMOS transistor being connected to said input terminal, said source terminal of said second NMOS transistor being connected to said ground supply terminal, and said drain terminal of said second NMOS transistor being connected to said output terminal.

17. A DAC current source structure, comprising:
means for providing a first current;
an output transistor of a first channel width-to-length ratio having gate, source and drain terminals, said gate terminal receiving a reference voltage, said source terminal of said output transistor connected to said first current means for receiving said first current to flow across said source and drain terminals of said output transistor;
a steering transistor of a second channel width-to-length ratio having gate, source and drain terminals, said gate terminal of said steering transistor receiving a steering signal having first and second states, such that when said steering signal is in said first state, said steering transistor causes said first current to flow across said source and drain terminals of said steering transistor, thereby causing a first voltage to be imposed at said source terminal of said output transistor;
means having an output terminal for providing a second current being substantially four times said first current;
a first transistor of substantially said first channel width-to-length ratio having gate, source and drain terminals, said gate terminal and said drain terminals being connected together and providing said reference voltage, and said source terminal of said terminal of said first transistor being conencted to said output terminal of said second current means;
a second transistor of substatially said second channel width-to-length ratio having gate, source and drain terminals, said second transistor being in a conducting state, said second transistor connected such that said second current is received from said second current means to flow across said source and drain terminals of said second transistor, thereby causing a second voltage to be imposed on said output terminal of said second current means; and
a differential amplifier for equalizing said reference voltage and the voltage on said output terminal of said second current means.

18. A structure as in claim 17, further comprising means connected between said steering transistor and said source terminal of said output transistor for smoothing current spike in said first current when said steering signal transitions from said first state to said second state.

19. A structure as in claim 18, wherein said current smoothing means comprises a transistor in a conducting state.

20. A structure as in claim 17, wherein said first and second current means each comprise a transistor in saturation, said transistor of said second current means being substantially four times the size of said transistor of said first current means.

21. A method for providing a DAC current source structure, comprising the steps of:
providing means for providing a first current;
providing an output transistor of a first channel width-to-length ratio having gate, source and drain terminals, said gate terminal receiving a reference voltage, said source terminal of said output transistor connected to said first current means for receiving said first current to flow across said source and drain terminals of said output transistor;
providing a steering transistor of a second channel width-to-length ratio having gate, source and drain terminals, said gate terminal of said steering transistor receiving a steering signal having first and second states, such that when said steering signal is in said first state, said steering transistor causes said first current to flow across said source and drain terminals of said steering transistor, thereby causing a first voltage to be imposed at said source terminal of said output transistor;
providing means having an output terminal for providing a second current being substantially four times said first current;
providing a first transistor of substantially said first channel width-to-length ratio having gate, source and drain terminals, said gate terminal and said drain terminals being connected together and providing said reference voltage, and said source terminal of said terminal of said first transistor being conencted to said output terminal of said second current means;
providing a second transistor of substatially said second channel width-to-length ratio having gate, source and drain terminals, said second transistor being in a conducting state, said second transistor connected such that said second current is received from said second current means to flow across said source and drain terminals of said second transistor, thereby causing a second voltage to be imposed on said output terminal of said second current means; and
providing a differential amplifier for equalizing said reference voltage and the voltage on said output terminal of said second current means.

22. A method as in claim 21, further comprising the step of smoothing current spike in said first current when said steering signal transitions from said first state to said second state.

23. A method as in claim 22, wherein said current smoothing step comprises the step of providing a transistor in a conducting state connected between said steering transistor and said output transistor.

24. A method as in claim 23, wherein said steps of providing first and second current each comprise the step of providing a transistor in saturation, said transistor for providing said second current being substantially four times the size of said transistor for providing said first current.

* * * * *